United States Patent [19]

Bandura

[11] Patent Number: 4,516,310
[45] Date of Patent: May 14, 1985

[54] CUT-CLINCH MECHANISM FOR VARIABLY SPACED COMPONENT LEADS

[75] Inventor: Vitaly Bandura, Danvers, Mass.

[73] Assignee: USM Corporation, Farmington, Conn.

[21] Appl. No.: 469,788

[22] Filed: Feb. 25, 1983

[51] Int. Cl.³ .............................................. B21F 1/00
[52] U.S. Cl. ................................. 29/566.3; 29/564.8; 29/715; 29/741; 140/105; 227/79
[58] Field of Search ..................... 29/566.3, 741, 566.1, 29/564.6, 715, 564.8; 140/105, 93 D, 1; 227/2, 79, 91, 155; 83/196, 198, 200

[56] References Cited

U.S. PATENT DOCUMENTS

| | | | |
|---|---|---|---|
| 2,808,587 | 10/1957 | Hancock | 227/2 |
| 3,539,086 | 11/1970 | Ragard | 227/2 |
| 3,593,404 | 7/1971 | Ragard | 29/566.1 X |
| 3,986,533 | 10/1976 | Woodman, Sr. | 29/566.3 X |
| 4,125,136 | 11/1978 | Olcese et al. | 140/93 D X |
| 4,135,558 | 1/1979 | Ragard et al. | 140/105 |
| 4,151,637 | 5/1979 | Zemek et al. | 29/715 X |
| 4,153,082 | 5/1979 | Foley | 140/105 |
| 4,288,914 | 9/1981 | Vancellette | 140/105 X |
| 4,309,808 | 1/1982 | Dean et al. | 140/105 X |
| 4,314,402 | 2/1982 | Lemmer | 29/741 X |
| 4,403,406 | 9/1983 | Foley | 29/741 X |

*Primary Examiner*—William R. Briggs
*Assistant Examiner*—Glenn L. Webb
*Attorney, Agent, or Firm*—Alan N. McCartney

[57] ABSTRACT

A mechanism for cutting and clinching spaced leads of variously sized electrical components which leads have been inserted through preselected openings in a printed circuit board either by a manual insertion or automatic insertion. The cut-clinch mechanism has a housing adapted to be moved toward and away from the underside of the board, the housing carrying a fixed cutting and clinching head and a movable cutting and clinching head positioned by a drive mechanism that is program controlled for each given component inserted into the board to properly space the movable cut-clinch head from the fixed head so that the leads of the variously sized given components can be automatically cut and clinched.

5 Claims, 7 Drawing Figures

CUT-CLINCH MECHANISM FOR VARIABLY SPACED COMPONENT LEADS

BACKGROUND OF THE INVENTION

In the assembly of electrical components to a printed circuit board, for any given board circuit, a plurality of components must be applied that have different dimensions and thus different spacings between the leads of the components. The component leads are either manually or automatically inserted into preselected holes in the board. Once the leads are inserted into the board, a cutting and clinching unit positioned below the board will cut off the excess lead and bend or form (clinch) the remaining lead to securely attach the component to the board. After all necessary components have been assembled to the board, the entire assembly goes through a wave solder process to complete the board assembly.

This assembly process can be semi-automatic by the operator having components supplied in a preselected sequence through a programmed supply source such as illustrated in U.S. Pat. No. 4,273,393. With the board fixed in a station available to the operator, the preselected component is inserted into the board at a location identified to the operator and a cut-clinch unit programmed to cut and clinch the preselected component is activated by the operator to move into position and cut and clinch the component leads. Examples of such cut-clinch units are illustrated in U.S. Pat. Nos. 4,288,914 and 4,292,727. Additionally, such cut-clinch units are mounted to move toward and away from the board and to rotate with respect to the board since the angular disposition of the components inserted into the board vary with respect to one another. An example of this type of unit is illustrated in U.S. Pat. No. 4,153,082.

BRIEF SUMMARY OF THE INVENTION

A cut and clinch mechanism having a housing carrying a fixed cut-clinch head and a movable cut-clinch head, the housing having a driver programmable to position the movable head to properly space the heads for a given component to cut and clinch the component leads.

It is a further object of this invention to provide a programmable driver for a movable cut-clinch head that transfers rotary motion to lateral motion to incrementally space the movable head from a fixed cut-clinch head so that the heads can secure variable spaced leads on the components to a printed circuit board.

It is another object of this invention to provide fixed and movable cut-clinch heads to attach components having variable spaced leads to a printed circuit board, with the heads each having a light emitter that identifies the openings in the board through which the operator should insert the leads of the given component to be attached to the board.

It is an additional object of this invention to provide a cut-clinch mechanism having a housing carrying a fixed cut-clinch head that supports a movable cut-clinch head for movement toward and away from the fixed head and including a programmable drive mechanism for incrementally moving the movable head with respect to the fixed head to appropriately space the heads to cut and clinch variably spaced leads of electrical components.

DESCRIPTION OF THE PREFERRED EMBODIMENT

Figure 1:
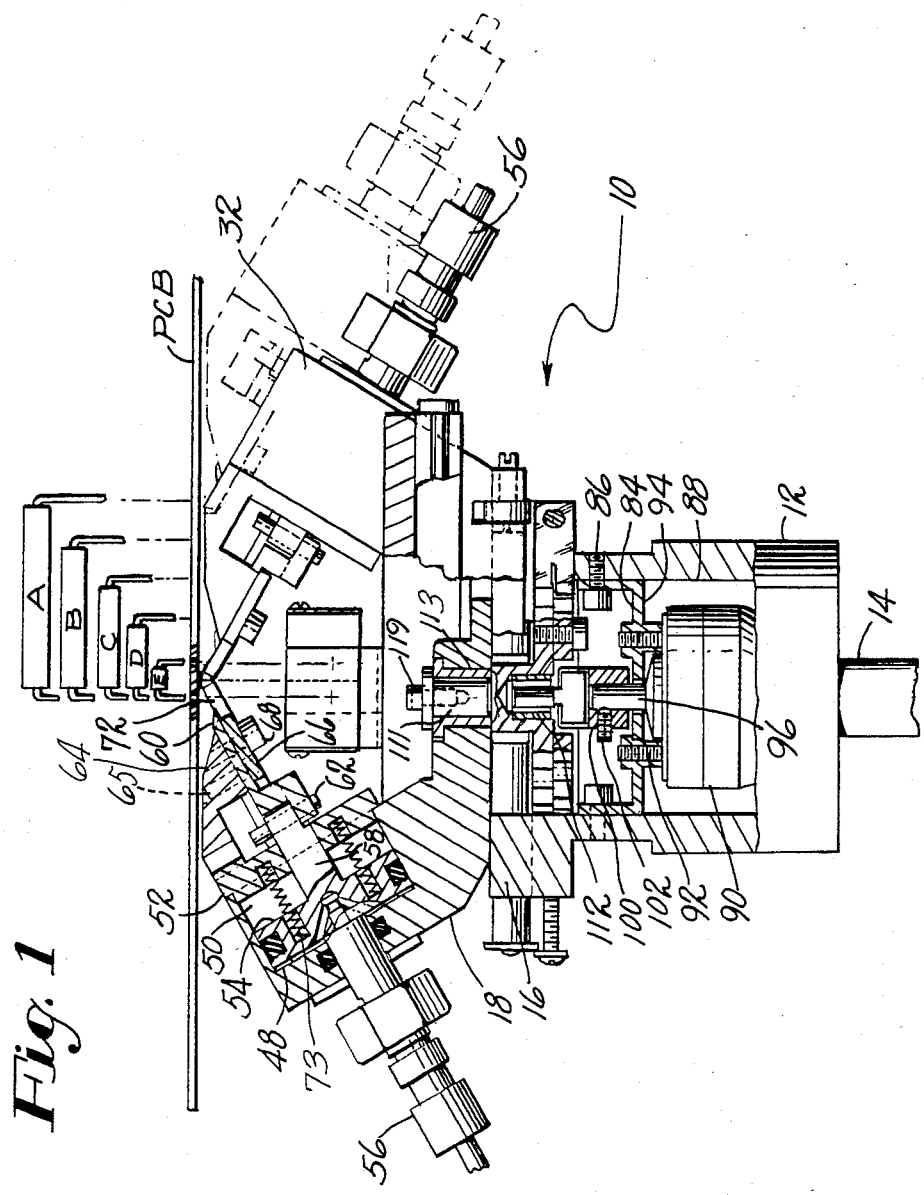
FIG. 1 is a side elevation view of the cut-clinch unit, partially in section, positioned adjacent the printed circuit board and illustrating the various components with their respectively spaced leads which can be assembled to the board.
Figure 2:
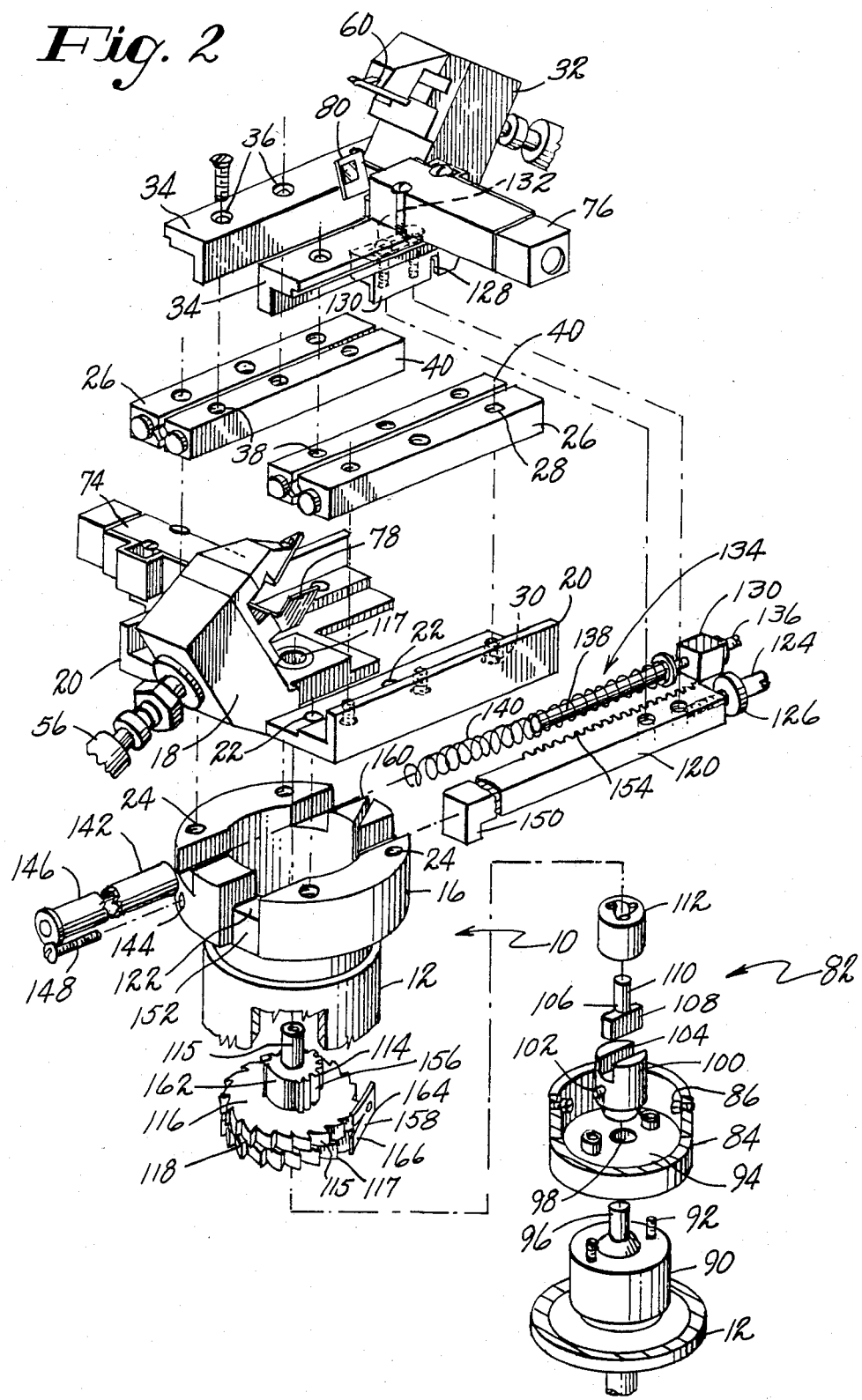
FIG. 2 is an exploded view of the cut-clinch mechanism of this invention.

Attention is directed to FIGS. 1 and 2 which illustrate the cut-clinch mechanism 10 having a main support housing 12 adapted to be carried on a shaft 14, for example, for movement on a support mechanism (not shown) toward and away from a printed circuit board (PCB). The housing is also adapted to be mounted for rotational movement to cut and clinch different angularly disposed components. An illustration of this kind of mounting for the entire cut-clinch unit is shown in U.S. Pat. No. 4,153,082.

The housing 12 has a flange 16 on which the fixed cut-clinch head 18 is mounted. The fixed head 18 has a pair of opposed L-shaped flanges 20 each with an arrangement of openings 22 through which fastening means (not shown) are inserted and threaded into a corresponding arrangement of openings 24 in the flange 16 to secure the head 18 to the housing 12.

Carried on L-shaped flanges 20 are a pair of opposed rails 26 secured by a fastener means (not shown) passing through an array of openings 28 and threaded into an additional arrangement of openings 30 in the L-shaped flanges 20.

Figure 7:
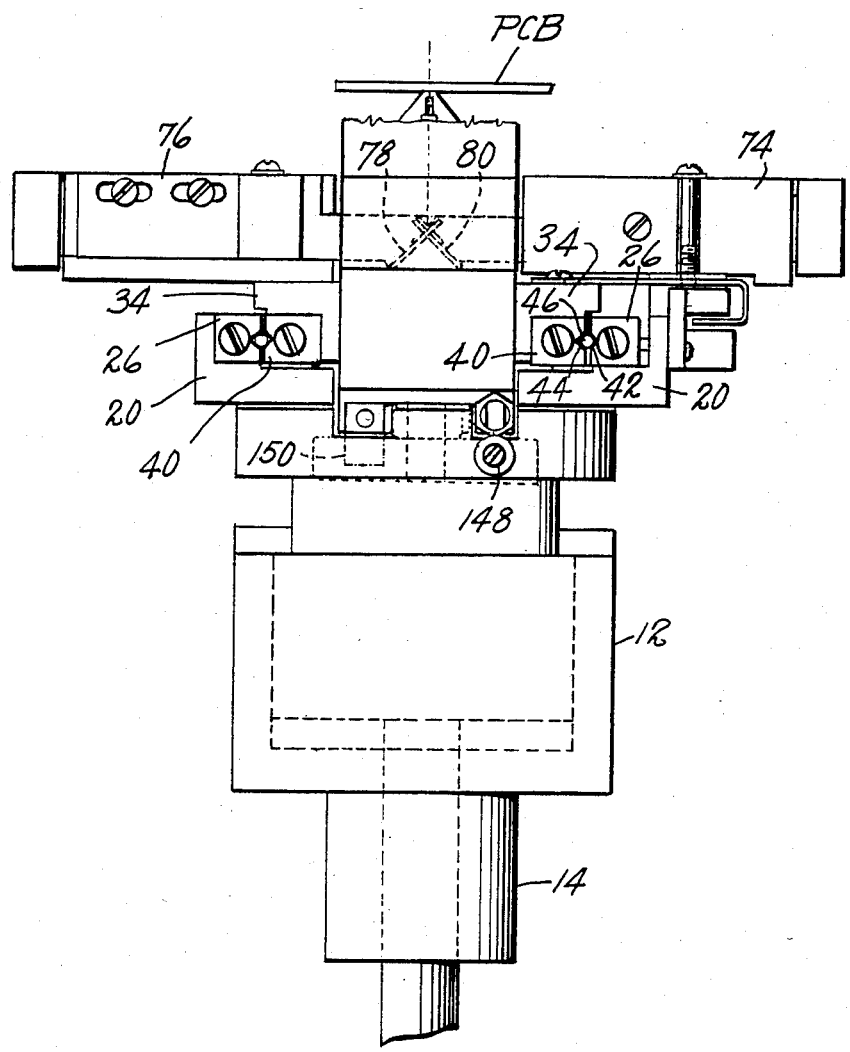
FIG. 7 is an end elevational view of the cut-clinch mechanism of this invention.

A movable cut-clinch head 32 has a pair of inverted L-shaped flanges 34 which are secured to a set of rails 40 by a threaded fastener through openings 36 and openings 38. The rails 26 and 40 have opposed grooves 42, 44 (see FIG. 7) in which a plurality of friction bearings 46 ride so that rails and thus the heads are movable toward and away from one another.

Attention is now directed to FIGS. 1 and 2 which illustrate the details of the cut and clinch heads which secure the component leads to the board. The fixed and movable heads 18 and 32 are identical in construction and therefore the details of only the fixed head 18 will be discussed. The head has a cylinder 48 formed by an opening 50 in the head which is enclosed by a cap 52. A piston 54 is carried in cylinder 48 and is operated by air through an air line 56. A piston rod 58 on piston 54 carries a movable knife 60 by means of a pin 62. The cap 52 has a nosepiece 64 positioned below the surface of the board and which has a fixed knife 66 held on guide pins 65 and secured below the movable knife 60 by screws 68. The fixed knife 66 has an opening 72 through which a component lead is received. Upon actuation of the piston 54, the movable knife 60 passes over the opening 72 and cuts the component lead. Further movement of the knife 60 will force the remaining lead protruding below the board to be bent and clinched to the underside of the printed circuit board. Thereafter, release of air pressure will enable an arrangement of return springs 73 to move piston 54 to the position illustrated in FIG. 1. This operation of fixed and movable knives to cut and clinch component leads is also illustrated in U.S. Pat. No. 3,986,533. When the leads are cut-clinched, the angular disposition of the knife 60 tends to force the lead back out of the PCB opening. This is particularly true with respect to heavy leaded components. Thus, it is desirable to provide the heads with a shallow mounting angle as illustrated in FIG. 1.

To assist the operator in locating the proper openings in the board for insertion of the component leads, a pair of light sources 74 and 76 are mounted on the fixed and movable cut-clinch heads, respectively. These light sources emit light to a pair of mirrors 78, 80 positioned below the heads, so as to reflect light up through the opening 72 and through the opening in the board to indicate to the operator the specific openings into which the component leads are to be inserted for each size of component.

Attention is now directed to FIGS. 1 to 4 which illustrate a drive mechanism 82 which is programmed to position the movable cut-clinch head 32, depending upon which of the various sized components A, B, C, D or E (see FIG. 1) is to be inserted at a particular point in the insertion sequence for assembly of the components to the board. The support housing 12 has a cup-shaped member 84 secured by a pair of attachment means 86 to an internal wall area 88. The cup-shaped member 84 suspends a solenoid 90 by a pair of threaded fasteners 92 mounted in the bottom 94 of the cup-shaped member 84.

A solenoid pin 96 passes through an opening 98 in the cup-shaped member 84 and carries a slotted nut 100 by a set screw 102 (Energizing solenoid 90 will rotate the solenoid pin 96 and rotate the nut 100 to drive the movable head 32 as will become apparent hereinafter). A slot 104 in the slotted nut 100 carries a T-shaped drive pin 106 that has a flange 108 received in the slot 104. A leg 110 of the drive pin 106 is positioned in a one-way clutch 112 which is secured in a pinion gear 114. The pinion gear 114 has an end portion 111 passing through an opening 113 in head 18 and receives a cap screw 119.

The pinion gear 114 has an arrangement of stop discs 116, 118 mounted on its lower end for reasons that will become clear hereinafter. A rack 120 is carried in a groove 122 in the flange 16 of the support housing 12. The rack 120 has a threaded adjustment pin 124 on which a disc 126 is mounted to engage a slot 128 of a lug member 130 secured to the L-shaped flange 34 by a fastening means 132.

Also, carried on the lug member 130 is a return spring mechanism 134. Threaded through the lug member 130 is an adjustment screw 136 threaded in a rod 138. A compression spring 140 surrounds the rod 138 and abuts a shoulder 139 on the rod 138. The spring 140 is carried in a cylindrical housing 142 positioned in a groove 144 in the flange 16 of support housing 12. The end 146 of cylindrical housing 142 is secured by a lock screw 148 to the side of the support housing 12. Since the return mechanism 134 is secured at one end to housing 12 and through the lug member 130 it is attached to the movable cut-clinch head, the spring 140 forces the movable head away from the fix head through the interconnecting rails 26 and 40 between the heads. The rack 120 has a downwardly projecting stop 150 acting against a recess 152 in the housing 12 to limit the outward movement of the movable head 32 and locate the rack according to the pinion.

Figure 5:
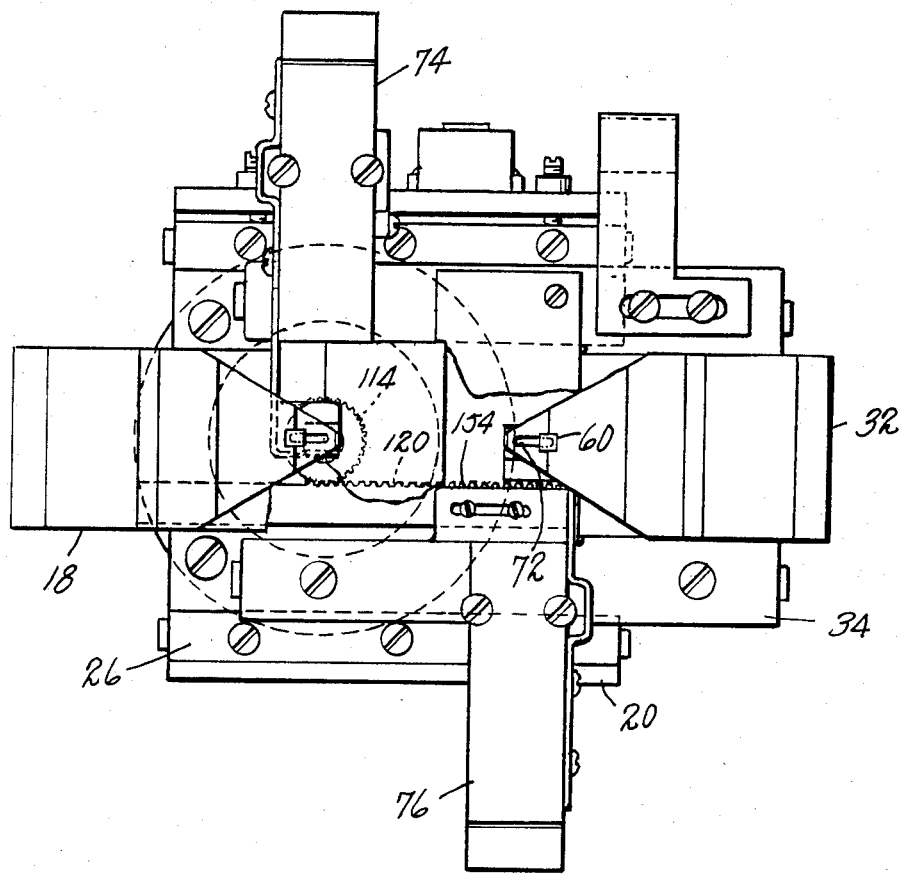
FIG. 5 is a top plan view of the cut-clinch mechanism illustrating the cut-clinch heads separated to cut and clinch the largest spaced component leads.
Figure 6:
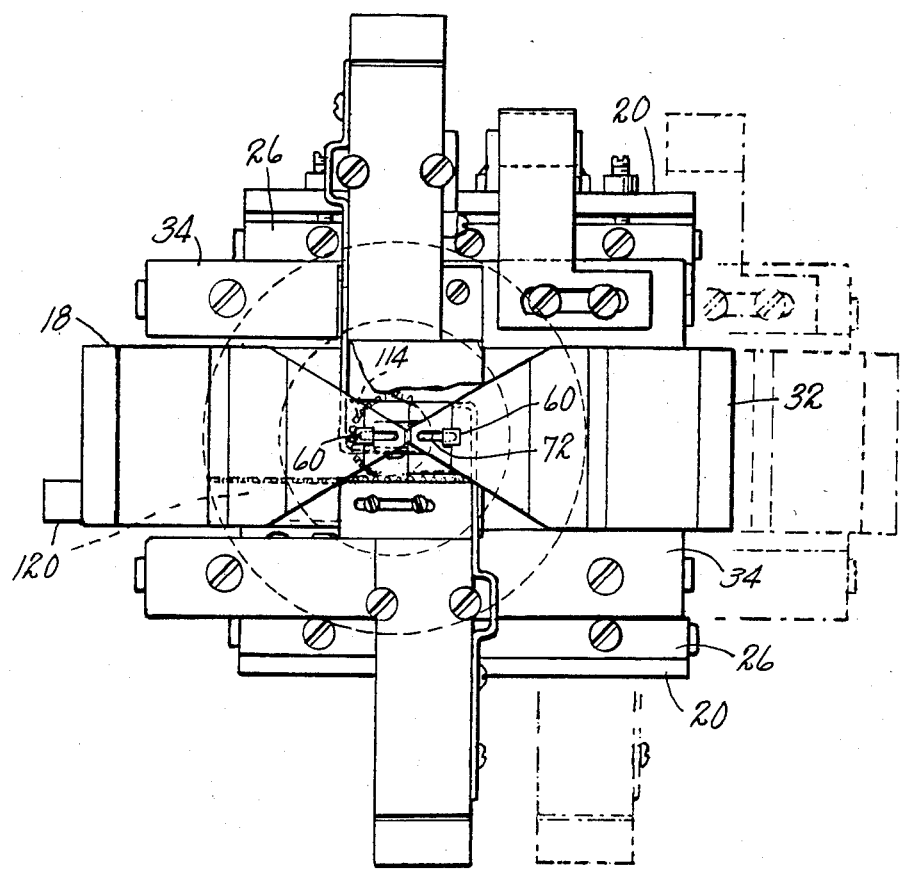
FIG. 6 is similar to FIG. 5 with the cut-clinch heads positioned to cut and clinch the smallest spaced component leads.

In the operation of the drive mechanism 82 for positioning the movable cut-clinch head for the preselected component (either of A to E, for example), the solenoid 90 is energized a programmed amount to rotate the solenoid pin 96 which in turn rotates the pinion 114 through the connection of the nut 100, the pin 106 and the clutch 112. The pinion 114 will thus be rotated in the direction illustrated in FIGS. 3 and 4 a preselected angular amount which rotates the rack 120 through the rack and pinion teeth interconnection 154, 156. Since the rack 120 is being moved laterally, the movable cut-clinch head 32 will be moved toward the fixed head 18. The teeth 115, 117 on discs 116, 118 coact with a leaf spring 158 carried in a slot 160 in housing 12. As the pinion 114 is both rotated, and then stopped by deenergizing solenoid 90, the leaf spring 158 engages either teeth 115, 117 and reacts against the reverse rotational force applied to pinion 114 though the loading of spring 140 while moving the rack to the left as viewed in FIG. 3. It can thus be seen that through the solenoid 90 and the rack and pinion drive, the movable head can be incrementally moved toward the fixed head and positioned for cutting and clinching a variety of differently spaced leads of any of the various components A to E. The solenoid 90 has a return spring (not shown) that rotates pin 96 back to its original position when the solenoid is deenergized. The drive to pinion gear 114 through one way clutch 112 however, will permit the pin 96 to freely reverse rotation to its original position. The movable head will thus go from the position illustrated in FIG. 5 to the position of FIG. 6.

The movement of the movable head 32 away from the fixed head 18 is accomplished as follows. From the position illustrated in FIG. 3 to FIG. 4, as the pinion gear 114 is rotated against rack 120, the flat 162 (toothless area) on the pinion gear 114 is reached which disengages the pinion gear 114 from the rack 120. At this point, the loading of compression spring 140 will force the lug member 130 to the right forcing the movable head to its outer position until the stop 150 on the rack 120 engages the recess 152 in the housing 12. At this point, the heads are again fully separated. Further rotation of the pinion gear 114 will now cause the flat 162 to pass the rack teeth 154 until the rack and pinion teeth 154, 156 again engage. The continued rotation of the pinion will enable the rack (and thus the movable head) to be laterally moved to the preselected desired location depending upon the lead spacing of the component next in sequence to be inserted into the printed circuit board (PCB).

The drive mechanism 82 thus described enables the rotary motion of the solenoid 90 to be transferred to lateral motion of the movable head 32 whereby the movable head 32 can be placed at any one of a number of preselected positions for cutting and clinching preselected component leads. For example, should the movable head be positioned to cut-clinch component "C" and the next component to be inserted is component "D" or "E" the solenoid 90 is energized through the program control to move the pinion gear 114 and thus rack 120 the desired amount to reposition the movable head to the desired location. If however, the movable head must be repositioned to cut-clinch components "A" or "B" from the position of component "C", the solenoid 90 is energized a sufficient amount to rotate the pinion and move the rack 120 all the way to the right in FIG. 3 to the position shown in FIG. 4 wherein the teeth 154, 156 disengage causing the return mechanism 134 to move the movable head to the right. Further rotation of the pinion gear 114 will then reengage the teeth 154, 156 so that the movable head can be moved to the left toward the fixed head to the desired location depending upon which component "A" or "B" is next in sequence to be inserted.

Figure 3:
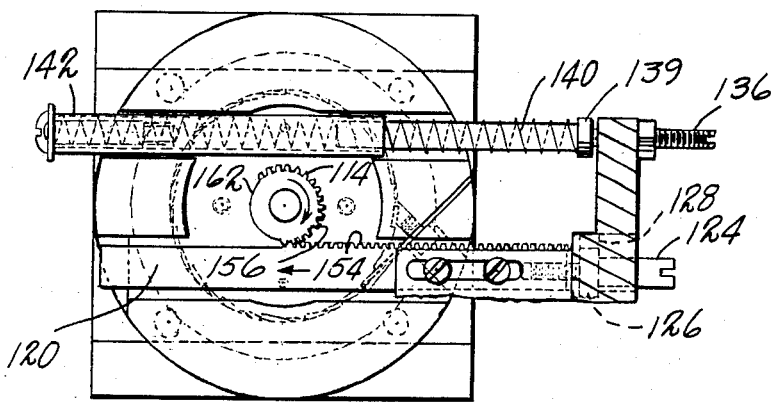
FIG. 3 is a top plan view of the rack and pinion mechanism that positions the movable cut-clinch head.
Figure 4:
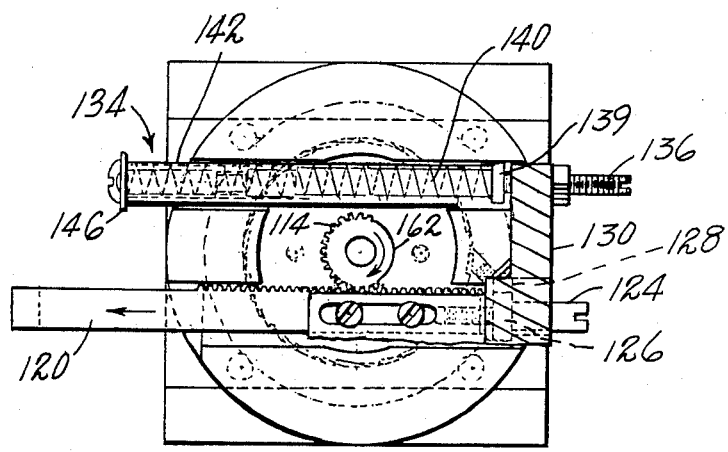
FIG. 4 is a view similar to FIG. 3 illustrating the rack and pinion in another position of adjustment.

Attention is also directed to FIGS. 3 and 4 which illustrate the adjustment pin 124 passing through connection disc 126 to the body of rack 120. Manual rotation of this adjustment pin will reposition the rack 120 on pinion gear 114 to give a finite adjustment to the location of the stationary positions assumed by the movable head.

Additional finite adjustment for spacing the movable head from the fixed head is also accomplished through the provision of the two stop disc 116, 118. As illustrated in FIG. 2, the teeth on disc 118 are half way between the pitch of the teeth on disc 116. Further, the spring 158 has a pair of legs 164, 166 which engage the teeth 115, 117 on the discs 116, 118 respectively. If a given amount of movement of head 32 is desired, the solenoid 90 can be rotated so that the spring leg 164 will always engage teeth 115. However, one-half of this movement can be accomplished by only rotating the pinion gear 114 through an angle which will engage the leg 166 to the teeth 117 from a position wherein the leg 164 engaged the teeth 115 of the discs. Thus, by rotation of the solenoid 90 so that the teeth 115, 117 are alternately engaged, half increment movement of the movable head 32 can be accomplished.

I claim:

1. A mechanism for cutting and clinching variable spaced leads of electrical components that have been inserted into a printed circuit board comprising of:
   (a) a support housing;
   (b) a fixed cut and clinch head mounted on said support housing having means to cut and clinch component leads;
   (c) a movable cut and clinch head having means to cut and clinch component leads;
   (d) rail means supporting said movable head on said fixed head for lateral movement of said movable head toward and away from said fixed head to accommodate cutting and clinching variable spaced component leads;
   (e) a programmable drive mechanism for moving said movable head with respect to said fixed head to incrimentally position said movable head a multiplicity of spacings from said fixed head;
   (f) said drive mechanism including a rack carried on said movable head and a pinion engaging with said rack, said pinion being driven by a drive shaft passing through said housing in a direction normal to the lateral movement of said movable head.

2. The mechanism set forth in claim 1, wherein said rack and pinion are releasable from one another when said heads are in close proximity and a return spring moves said movable head away from said fixed head.

3. The mechanism set forth in claim 2, wherein said rack has a stop acting against said support housing to limit the outward movement of said movable head.

4. The mechanism set forth in claim 1, wherein each of said heads carry a light emitter which permits light to shine through the prescribed openings in the board to enable a machine operator to identify the proper openings in the board into which component leads may be inserted.

5. The mechanism of claim 1 wherein said drive shaft is driven by solenoid to transfer the rotational movement of said drive shaft to lateral movement of said movable head through said rack and said pinion.

* * * * *